Figure 1:
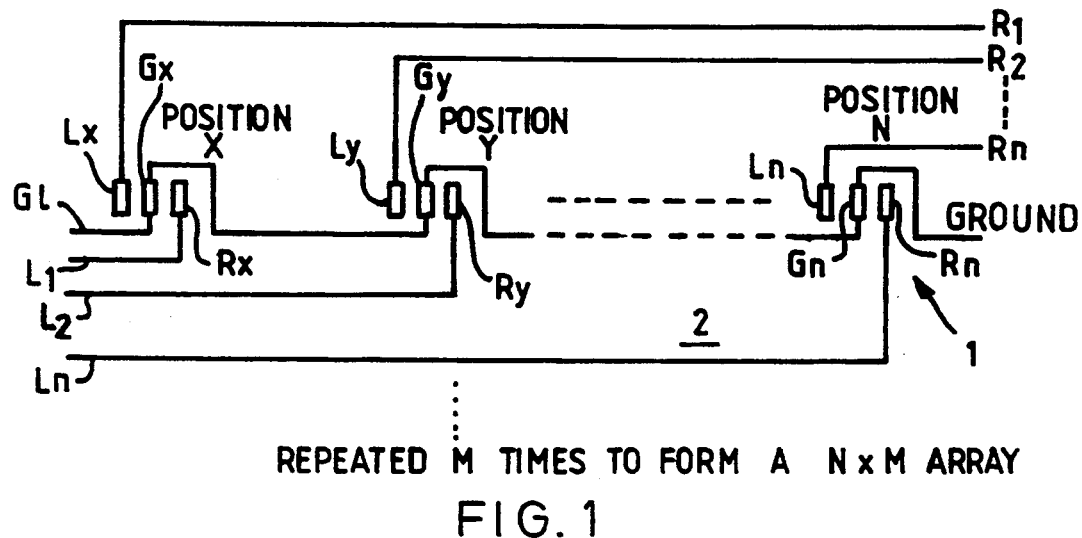

United States Patent [19]
Chan et al.

[11] Patent Number: 5,403,648
[45] Date of Patent: Apr. 4, 1995

[54] CONTACT SENSITIVE SUBSTRATE

[75] Inventors: Yiu S. Chan; Goon N. Lee; York Liao; Ying M. Poon, all of Kowloon, Hong Kong

[73] Assignee: Varintelligent (BVI) Limited, Tortola, Virgin Islands (Br.)

[21] Appl. No.: 54,784

[22] Filed: Apr. 28, 1993

[30] Foreign Application Priority Data

Apr. 30, 1992 [GB] United Kingdom ............... 9209362

[51] Int. Cl.$^6$ .............................................. B32B 9/00
[52] U.S. Cl. .................................... 428/209; 428/901
[58] Field of Search ............................ 428/209, 901

[56] References Cited

U.S. PATENT DOCUMENTS

| | | | |
|---|---|---|---|
| 3,787,732 | 1/1974 | Larson | 307/116 |
| 4,035,593 | 7/1977 | Riniker | 200/5 A |
| 4,053,789 | 10/1977 | Schultz | 307/116 |
| 4,157,539 | 6/1979 | Hunts et al. | 340/365 C |
| 4,178,403 | 12/1979 | Sakurai et al. | 428/209 |
| 4,258,096 | 3/1981 | LeMarche | 428/209 |
| 4,290,052 | 9/1981 | Eichelberger et al. | 340/365 C |
| 4,627,161 | 12/1986 | Cushman | 29/838 |

FOREIGN PATENT DOCUMENTS

| | | | |
|---|---|---|---|
| 0015438 | 2/1980 | European Pat. Off. | H03K 17/96 |
| 2016704 | 9/1979 | United Kingdom | H03K 17/02 |
| 2022264 | 12/1979 | United Kingdom | H03K 17/00 |
| 2029056 | 3/1980 | United Kingdom | H03K 17/96 |
| 2066548 | 7/1981 | United Kingdom | G10H 1/34 |
| 1603862 | 12/1981 | United Kingdom | H03K 17/00 |
| 2133600 | 7/1984 | United Kingdom | G06K 9/28 |

OTHER PUBLICATIONS

Hiniker, T., *Noise Immunity of Capacitive Switch Improves With Flip-Flop Interface,* Electronic Design, vol. 26, No. 15, Jul. 19, 1978.

*Primary Examiner*—Patrick J. Ryan
*Assistant Examiner*—Kam F. Lee
*Attorney, Agent, or Firm*—Weingarten, Schurgin, Gagnebin & Hayes

[57] ABSTRACT

A contact sensitive substrate for electronic equipment comprising a plurality of touch pads and respective associated leads defining an array of touch positions on a front (in use) face of the substrate.

11 Claims, 1 Drawing Sheet

REPEATED M TIMES TO FORM A N x M ARRAY

CONTACT SENSITIVE SUBSTRATE

The invention relates to a contact sensitive substrate, particularly a conductor pattern operated by touch and based on the electrical discharge property of the human body.

Usually in direct contact sensing, both sensing pads and leads therefor are exposed on the front surface of a touch plate forming the substrate. There is the danger of the finger touching the leads, so leading to a mis-sensing. This problem has been addressed by covering the substrate leaving only the pads exposed, but this is cumbersome and unreliable because capacitive coupling can still cause mis-triggering.

It is an object of the invention to seek to mitigate this disadvantage.

According to a first aspect of the invention there is provided a contact sensitive substrate for electronic equipment, comprising:

(i) a plurality of touch pads;
(ii) a plurality of leads for said touch pads;
(iii) said touch pad and leads defining an array of touch positions, each said touch position including a plurality of touch pads, the touch pads of each said touch position being electrically isolated from one another;
(iv) said substrate having a major surface; and
(v) said array being at said major surface, wherein respective leads of said touch pads run from opposite sides of said major surface, and contact between two or more touch pads established through contact by a user permits transmission of a signal.

This provides a particularly efficient system, without mis-sensing or mis-triggering by touching the leads, particularly where there are two touch pads at each touch position.

One pad at one touch position may comprise a touch pad for an immediately adjacent touch position in the array.

The multi-position array provides great flexibility in operation.

The array may be linear, or may comprise a two-dimensional matrix of a plurality of linear arrays.

There may be an earthed touch pad between the two touch pads at the or each touch position. This provides for greater sensitivity, and efficiency as the lead to the earth or ground may be shared between each touch position.

The substrate may comprise a sheet of glass on which the or each touch position is fixed, suitably by etching, which is very efficient when the sheet of glass is coated with indium tin oxide.

Suitably the glass may be transparent, which provides an efficient system which can be readily applied to a display such as an LCD.

It will be understood that this invention extends to an electronic display, in combination with a substrate as hereinbefore defined.

Contact sensitive substrates for electronic equipment are hereinafter described, by way of example, with reference to the accompanying drawings.

Figure 2:
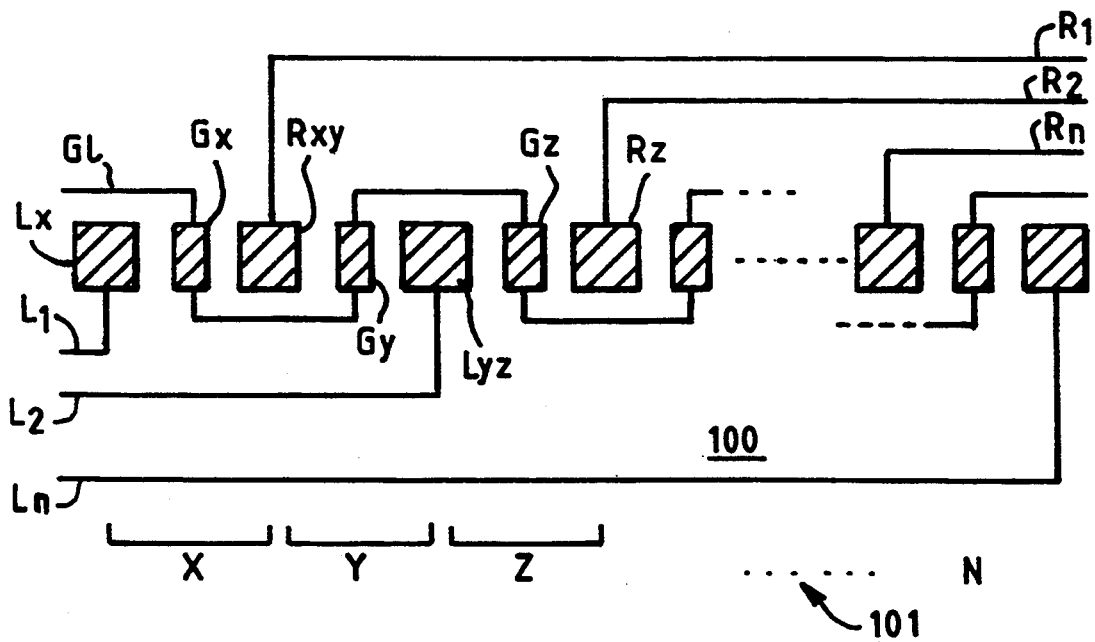

FIG. 1 shows schematically an array of touch positions of a first embodiment of substrate according to the invention; and FIG. 2 shows schematically an array of touch positions of a second embodiment of substrate according to the invention.

Referring to the drawings in which like pans are shown by like numerals, there is shown in FIG. 1 a contact sensitive substrate 1 for electronic equipment, comprising a plurality of associated touch pads defining a touch position. The substrate is in the embodiment a transparent glass plate coated with a suitable coating such as indium tin oxide (ITO) on which a pattern, array or matrix 2 of discrete touch positions, X, Y ... N shown in the drawing is fixed as by being etched thereon. Each touch position, X, Y ... N comprises two pads Rx, Lx, Ry, Ly ... Rn, Ln, the respective leads $L_1$, $L_2$ ... Ln, $R_1$, $R_2$ ... Rn of which full from opposite sides of the plate 1. In the embodiment, there is an earth (ground) pad Gx, Gy ... Gn between each pad such as Rx, Lx at one touch position X, the lead $G_\iota$ to the ground pads being common or shared.

In use, the substrate 1 provides a transparent touch plate which can be placed over a display such as a LCD display and when a particular touch position such as X is actuated, as the leads $L_1$, $R_1$ to the individual pads Lx, Rx run in opposite directions it is not possible to touch both leads at the same time whilst both pads are required to be activated by touching with a finger of an operator to confirm a touch at that touch position X. Operation without mis-sensing and/or mis-triggering is thereby avoided.

This provides a relatively simple, inexpensive and yet rugged touch plate.

Referring now to the embodiment of FIG. 2, there is shown in that FIG. a contact sensitive substrate 100 comprising a plurality of associated touch pads defining a touch position. As in FIG. 1, the substrate 100 is in the form of a transparent glass plate coated with a suitable coating such as indium tin oxide (ITO) on which a pattern, array or matrix 101 of discrete touch positions X, Y, Z ... N is fixed as by being etched thereon. In FIG. 1, each touch position X, Y etc. comprises two pads. In the embodiment of FIG. 2, an intermediate pad Rxy Lyz Rz ... of the array shown, is used to identify or provide touch contact at both a position to the left and to the fight (as viewed), thus the pad Rxy provides part of the touch position 'X' with pad Lx and also the left hand (as viewed) pad with right hand pad Lyz of position 'Y'. Stated in another way, one touch pad R or L forms both a left hand part pad and a fight hand part pad for each touch position from left to fight, as viewed in FIG. 2. Thus it still, as in the embodiment 1 of FIG. 1, requires two pads to identify one touch position, so as to overcome mis-sensing. In the embodiment 100 of FIG. 2, however, each pad L, R (except for the pads at the far left and fight of the linear array shown) can be shared by two touch positions on each side. This results in both the number of pads and the number of leads $L_1$, $L_2$, ... Ln, $R_1$, $R_2$ ... Rn, which again run from opposite sides of the substrate 100, being reduced by approximately half in number.

There are earth (ground) pads Gx, Gy, Gz ... Gn at each position there being a common lead $G_\iota$ as before. The earth pads provide a greater sensitivity in the device.

Both embodiments show for simplicity a linear array of touch positions and leads on a front, in use, surface of the substrate.

This provides for direct contact with an operator. It will, however, be understood that the array can be repeated two dimensionally M times to form an N×M array or matrix with as many touch positions as desired.

In every embodiment, the pads are arranged in the array or matrix 2, 101 so that the leads L, R, G are not hidden away to the edges of the substrate 1,100.

We claim:

1. A contact sensitive substrate for electronic equipment, comprising:
   (i) a plurality of touch pads;
   (ii) a plurality of leads for said touch pads;
   (iii) said touch pads and leads defining an array of touch positions, each said touch position including a plurality of touch pads, the touch pads of each said touch position being electrically isolated from one another;
   (iv) said substrate having a major surface; and
   (v) said array being at said major surface, wherein respective leads of said touch pads run from opposite sides of said major surface, and contact between two or more touch pads established through contact by a user permits transmission of a signal.

2. A substrate as defined in claim 1, wherein there are two touch pads at each of said array of touch positions.

3. A substrate as defined in claim 2, wherein there is a ground touch pad between said two touch pads at each said touch position.

4. A substrate as defined in claim 1, wherein said array is linear.

5. A substrate as defined in claim 4, wherein said array is a two-dimensional matrix of a plurality of said linear arrays.

6. A substrate defined in claim 2, wherein there is a ground pad between said two touch pads at each said touch position and wherein there is a lead to said ground pad shared between each said touch position.

7. A substrate as defined in claim 1, wherein said substrate is a sheet of glass on which each touch position is fixed.

8. A substrate as defined in claim 7, wherein each touch position is fixed by etching.

9. A substrate as defined in claim 8, wherein the sheet of glass is coated with indium tin oxide.

10. A substrate as defined in claim 7, wherein the glass is transparent.

11. An electronic display, in combination with a substrate as defined in claim 1.

* * * * *

UNITED STATES PATENT AND TRADEMARK OFFICE
CERTIFICATE OF CORRECTION

PATENT NO. : 5,403,648
DATED : April 4, 1995
INVENTOR(S) : Yiu S. Chan, et al.

It is certified that error appears in the above-indentified patent and that said Letters Patent is hereby corrected as shown below:

Column 2, line 1, "like pans" should read --like parts--.

Column 2, line 12, "of which full from" should read --of which run from--.

Column 2, line 47, "from left to fight" should read --from left to right---.

Signed and Sealed this

Twenty-third Day of January, 1996

Attest:

BRUCE LEHMAN

Attesting Officer      Commissioner of Patents and Trademarks